United States Patent [19]
Yang

[11] Patent Number: 5,698,349
[45] Date of Patent: Dec. 16, 1997

[54] SUB-RESOLUTION PHASE SHIFT MASK

[75] Inventor: Ming-Tzong Yang, Hsin Chu, Taiwan

[73] Assignee: United Microelectronics Corporation, Hsin-Chu City, Taiwan

[21] Appl. No.: 670,271

[22] Filed: Jun. 21, 1996

Related U.S. Application Data

[62] Division of Ser. No. 307,232, Sep. 16, 1994, Pat. No. 5,591,549.

[51] Int. Cl.⁶ .................................................. G03F 9/00
[52] U.S. Cl. ............................................ 430/5; 430/313
[58] Field of Search ............................ 430/5, 322, 324, 430/313

[56] References Cited

U.S. PATENT DOCUMENTS

| | | | |
|---|---|---|---|
| 5,045,417 | 9/1991 | Okamoto | 430/5 |
| 5,288,568 | 2/1994 | Cathey | 430/5 |
| 5,300,379 | 4/1994 | Dao | 430/5 |
| 5,382,483 | 1/1995 | Young | 430/5 |
| 5,455,131 | 10/1995 | Kang et al. | 430/5 |
| 5,532,089 | 7/1996 | Adair et al. | 430/5 |

OTHER PUBLICATIONS

"Lithography's Leading Edge, Part 1: Phase Shift Technology," pub. in Semiconductor International, Feb. 1992, pp. 42–47.

*Primary Examiner*—S. Rosasco
*Attorney, Agent, or Firm*—William H. Wright

[57] ABSTRACT

The invention describes the fabrication and use of a sub-resolution phase shift mask. The mask is formed using a single alignment step with all other alignment steps being accomplished by self alignment. This self alignment is made possible by using vertical anisotropic etching of an opaque material layer to form opaque spacers at the pattern edges of phase shifting material. The opaque spacers combine with phase shifting and other opaque regions of the mask to provide improved image resolution and depth of focus tolerance at the surface of an integrated circuit wafer.

13 Claims, 4 Drawing Sheets

SUB-RESOLUTION PHASE SHIFT MASK

This is a division of application Ser. No. 08/307,232 filed on Sep. 16, 1994 now U.S. Pat. No. 5,591,549.

BACKGROUND OF THE INVENTION

(1) Field of the Invention

The invention relates to the use of a sub-resolution phase shift mask to improve image resolution in the fabrication of sub-micron integrated circuits and more particularly to a self aligning method to form the mask using vertical anisotropic etching of an opaque material.

(2) Description of Related Prior Art

As optical lithography advances to 0.5 to 0.35 microns and below new technologies are needed to improve the resolution of the imaging lens. Phase-shifting photomasks have been used to improve resolution as well as depth of focus. A transparent coating of thickness $t=0.5\ L/(n-1)$ (L=wavelength, n=index of refraction) is placed on a mask. The phase of the electric field of the light passing through the coated area is delayed 180° compared to the electric field of light passing through uncoated regions. At the boundary between the coated and uncoated regions the electric fields cancel producing an electric field null as well as an intensity null. This intensity null produces a sharper image as well as improved depth of focus at the integrated circuit wafer.

Phase-shifting photomasks are described in U.S. Pat. No. 5,045,417 to Okamoto which shows a variety of phase shifter processes. The article "LITHOGRAPHY'S LEADING EDGE, PART 1; PHASE-SHIFT TECHNOLOGY," published in Semiconductor International, February 1992, pages 42–47 describes a number of types of phase shifters but does not describe a process for forming phase shifters.

While improvements have been made in image resolution and depth of field, the linear dimensions used in integrated circuit technology call for even greater improvements in resolution and increased depth of field.

SUMMARY OF THE INVENTION

It is a principle objective of this invention to provide a method of forming a self-aligned sub-resolution phase shift photomask which can be used to achieve improved image resolution and depth of focus tolerance in integrated circuit fabrication.

This objective is achieved by using a method which requires only one alignment step. All other steps are self-aligned with this first alignment step. A layer of opaque material is formed over a transparent substrate. A layer of phase shifting material is then formed over the layer of opaque material. Next a layer of photoresist is formed over the layer of phase shifting material. A pattern is then formed in the photoresist using electron beam techniques. A pattern is then etched in the in phase shifting material using the photoresist pattern as a mask. Next a pattern is isotropically etched in the opaque material using the photoresist pattern and phase shifting material as a mask so that the mask is self aligning. The opaque material is over etched so that the pattern edges of the phase shifting material overhang the pattern edges of the opaque material. Next a second layer of opaque material is formed over the surface of the mask. This second layer of opaque material is then anisotropically etched vertically leaving a spacer of opaque material at the pattern edges of the phase shifting material and forming the sub-resolution phase shift mask. The mask formation requires only one alignment step, that of the pattern formation in the photoresist using the electron beam. This can be achieved because of the anisotropic etching of the second opaque material layer to form the spacers. All other alignment steps in forming the mask are self-aligned with the pattern formation in the photoresist using electron beam techniques.

It is a further principle objective of this invention to provide a sub-resolution phase shift photomask which can be used to achieve improved image resolution and depth of focus tolerance in integrated circuit fabrication.

This objective is achieved with a sub-resolution phase shift photomask which has a patterned layer of phase shifting material formed over a patterned layer of opaque material so that the pattern edges of the phase shifting material overhang the pattern edges of the opaque material. A second layer of opaque material is used to form a spacer at the pattern edges of the phase shifting material. This combination of phase shifting material overhanging the pattern edges of the opaque material and spacers at the pattern edges of the phase shifting material combine to provide improved image resolution and depth of focus tolerance. The self-aligned nature of the mask makes it possible to achieve an even greater level of image resolution.

The sub-resolution phase shift photomask is used in the fabrication of integrated circuit wafers to form a pattern image on the wafer surface. Light is projected through the mask and focused on the wafer surface. The combination of phase shifting material overhanging the pattern edges of the opaque material and spacers at the pattern edges of the phase shifting material combine to provide an interference pattern in the light exiting the mask. This interference pattern provides improved image resolution and depth of focus tolerance at the wafer surface. The image resolution at the surface of the wafer is further improved by the self aligning nature of the mask formation which results from the anisotropic etching of the opaque spacer.

DESCRIPTION OF THE PREFERRED EMBODIMENTS

Figure 1:
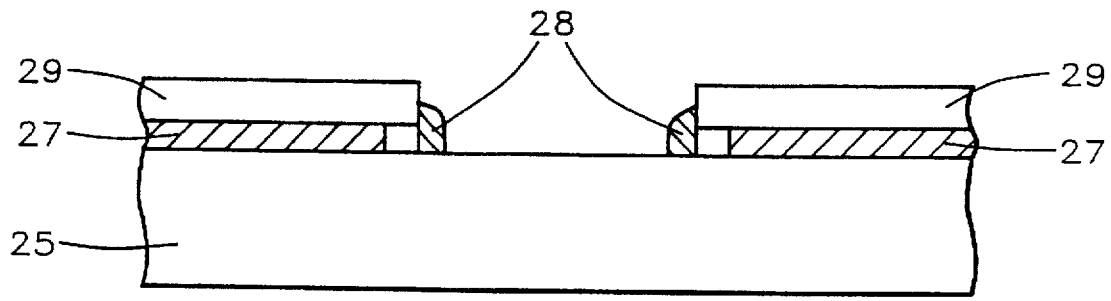
FIG. 1 is a cross sectional view of the sub-resolution phase shift mask.
Figure 2:
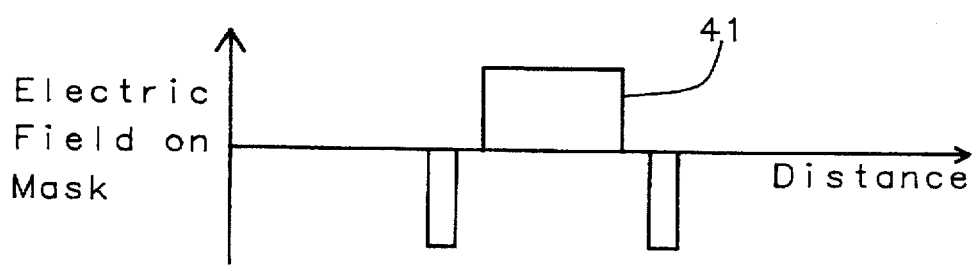
FIG. 2 shows the electric field strength of the light exiting the sub-resolution phase shift mask.
Figure 3:
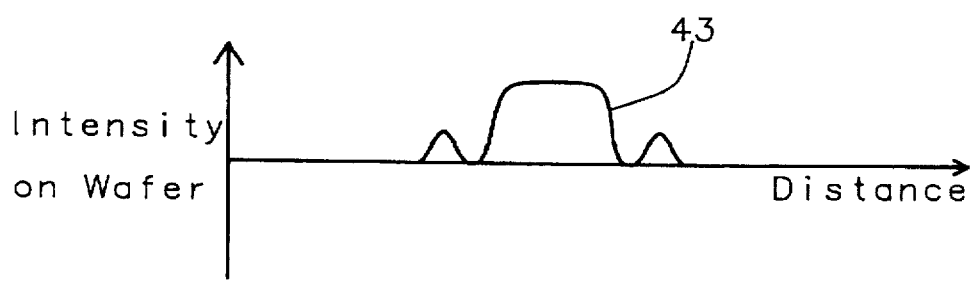
FIG. 3 shows the light intensity at the wafer surface.

Refer now to FIG. 1 through FIG. 3, there is shown an embodiment of the sub-resolution phase shift mask. A cross section of the mask is shown in FIG. 1. A patterned layer of chromium 27 with a thickness of between about 1000 and 10,000 Angsttoms is formed on a substrate of quartz 25 with a thickness of between about 1 and 10 millimeters. A patterned layer of phase shifting material 29, such as silicon dioxide with a thickness of between about 1000 and 5000 Angstroms is formed on the patterned layer of chromium 27 so that the pattern edges of the silicon dioxide 29 overhang the pattern edges of the chromium 27 by between about 500 and 5000 Angstroms. Opaque spacers of sputtered chromium 28 with a width of between about 300 and 3000 Angstroms are formed on the quartz substrate at the silicon dioxide pattern edges.

Light passing through the sub-resolution phase shift mask is focussed on the surface of the integrated circuit wafer. FIG. 2 shows the electric field of the light 41 exiting the sub-resolution phase shift mask. FIG. 3 shows the light intensity 43 at the wafer. Interference effects in the light at the surface of the wafer provide improved image resolution.

Figure 4:
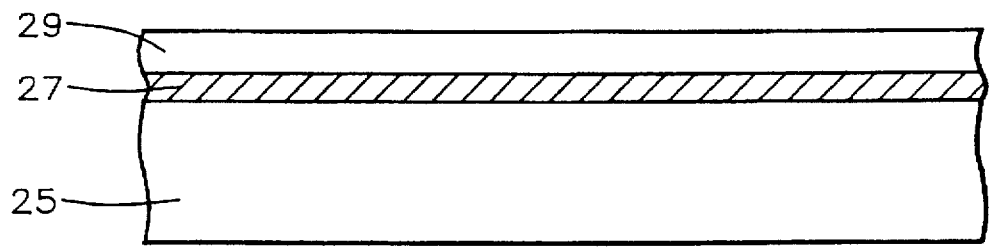
FIG. 4 is a cross sectional view of the sub-resolution phase shift mask after a layer of the first opaque material has been formed on the transparent substrate and a layer of phase shifting material has been deposited on the layer of first opaque material.

Refer now to FIG. 4 through FIG. 10, there is shown an embodiment for forming the sub-resolution phase shift mask. As shown in FIG. 4 a layer of chromium 27 with a thickness of between about 1000 and 10,000 Angstroms is formed on a quartz substrate 25 with a of thickness between about 1 and 10 millimeters. Next a layer of phase shifting material 29, such as silicon dioxide with a thickness of between about 1000 and 5000 Angstroms is formed on the layer of chromium.

Figure 5:
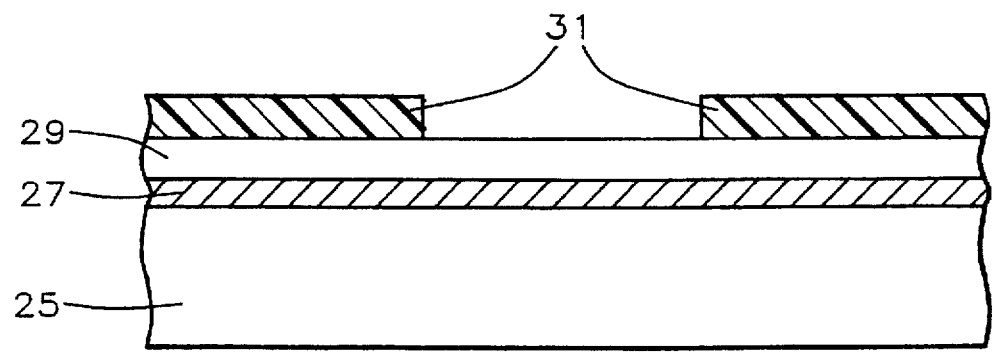
FIG. 5 is a cross sectional view of the sub-resolution phase shift mask after a layer of photoresist has been formed on the layer of phase shifting material, exposed by electron beam techniques, and developed.
Figure 6:
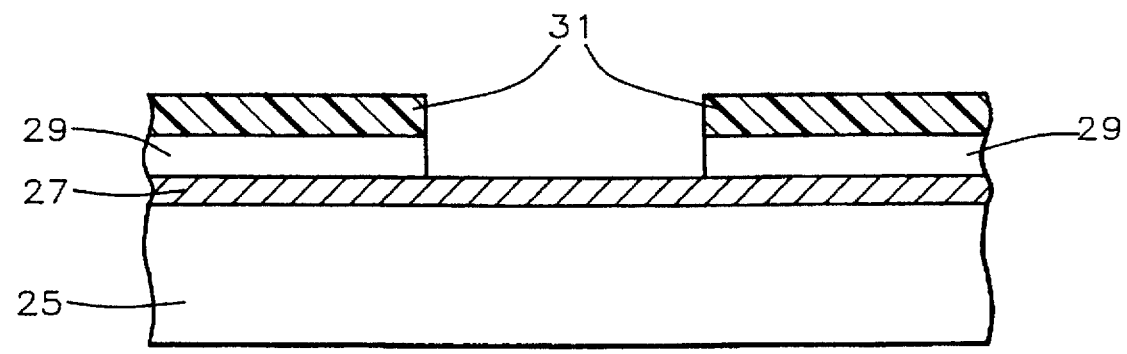
FIG. 6 is a cross sectional view of the sub-resolution phase shift mask after the pattern has been etched in the phase shifting material.
Figure 7:
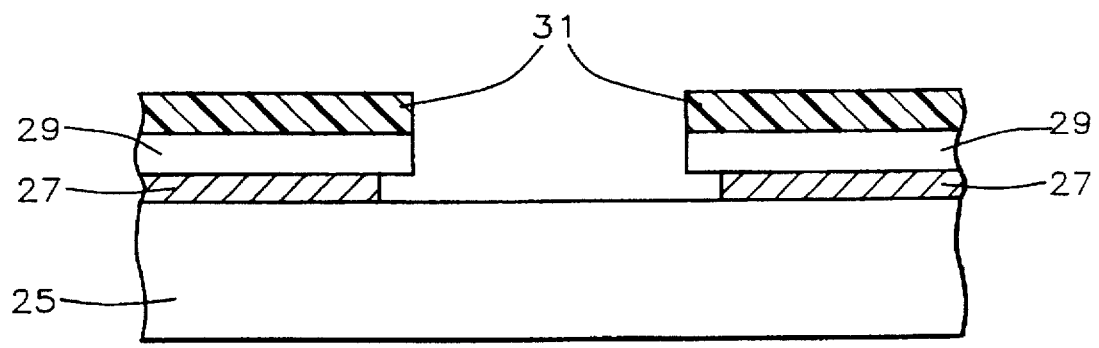
FIG. 7 is a cross sectional view of the sub-resolution phase shift mask after the pattern has been isotropically etched in the first opaque material.
Figure 8:
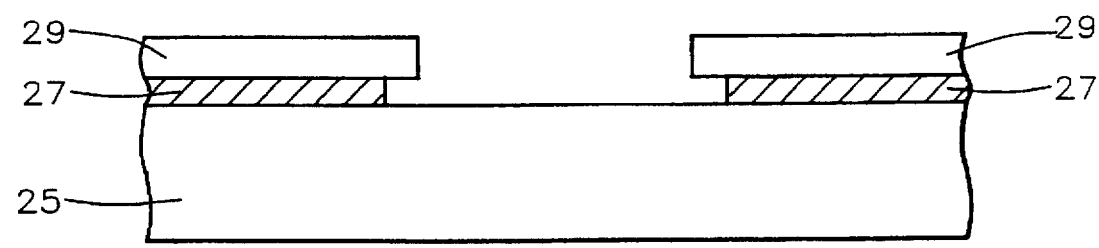
FIG. 8 is a cross sectional view of the sub-resolution phase shift mask after the photoresist has been stripped.

Next, as shown in FIG. 5, a layer of photoresist 31 is formed on the layer of silicon dioxide 29, exposed using electron beam techniques, and developed. As shown in FIG. 6 the silicon dioxide 29 is then etched to the desired pattern using reactive ion etching. As shown in FIG. 7 the chromium 27 is then isotropically etched, using the silicon dioxide and photoresist as a mask, to the desired pattern using wet etching methods. The isotropic etching of the chromium is continued until the pattern edges in the silicon dioxide 29 overhang the pattern edges in the chromium 27 by between about 500 and 5000 Angstroms. The photoresist is then stripped as shown in FIG. 8.

Figure 9:
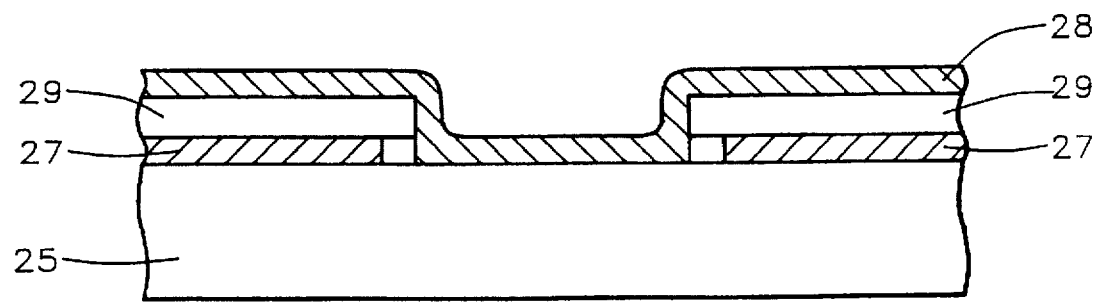
FIG. 9 is a cross sectional view of the sub-resolution phase shift mask after forming the layer of second opaque material.
Figure 10:
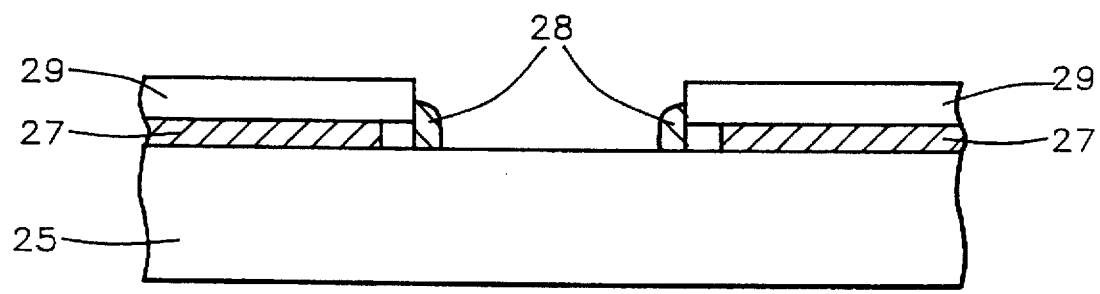
FIG. 10 is a cross sectional view of the sub-resolution phase shift mask after the second opaque material has been anisotropically etched vertically to form the spacers of second opaque material.

As shown in FIG. 9 a layer of sputtered chromium 28 with a thickness of between about 300 and 3000 Angstroms is formed on the surface of the mask. As shown in FIG. 10 the sputtered chromium is then vertically anisotropically etched using reactive ion etching to form the opaque spacers 28 at the pattern edges of the silicon dioxide.

This method of forming a sub-resolution phase shift mask requires only one alignment step, that of forming the pattern in the photoresist with the electron beam. All other alignment steps are self aligning. This self alignment is possible because the opaque spacers are formed without masking using vertical anisotropic etching.

While the invention has been particularly shown and described with reference to the preferred embodiments thereof, it will be understood by those skilled in the art that various changes in form and details may be made without departing from the spirit and scope of the invention.

What is claimed is:

1. A phase shift mask, comprising:

a transparent substrate;

a patterned layer of first opaque material formed on said transparent substrate;

a patterned layer of phase shifting material formed on said patterned layer of first opaque material to cover and extend beyond the edge of said patterned layer of first opaque material; and a patterned layer of second opaque material formed on said transparent substrate wherein said second opaque material forms spacers at said patterned layer of phase shifting material pattern edges.

2. The phase shift mask of claim 1 wherein said transparent substrate is quartz with a thickness of between about 1 and 10 millimeters.

3. The phase shift mask of claim 1 wherein said first opaque material is chromium with a thickness of between about 1000 and 10,000 Angstroms.

4. The phase shift mask of claim 1 wherein said phase shifting material is silicon dioxide.

5. The phase shift mask of claim 1 wherein said phase shifting material has a thickness of between about 1000 and 5000 Angstroms.

6. The phase shift mask of claim 1 wherein said phase shifting material has a thickness, t, given by $t=0.5\ L/(n-1)$ (L=wavelength of light used, n=index of refraction of said phase shifting material).

7. The phase shift mask of claim 1 wherein said second opaque material spacers are sputtered chromium with a thickness of between about 300 and 3000 Angstroms.

8. The phase shift mask of claim 1 wherein said patterned layer of phase shifting material extends beyond the edge of said patterned layer of first opaque material by between about 500 and 5000 Angsttoms.

9. The phase shift mask of claim 1, wherein said patterned layer of phase shifting material is spaced from said transparent substrate between said patterned layer of first opaque material and said spacers.

10. The phase shift mask of claim 9, wherein upper surfaces of said spacers are closer to said transparent substrate than an upper surface of said patterned layer of phase shifting material.

11. The phase shift mask of claim 9, wherein the transparent substrate has a planar surface over a width of an opening in said phase shift mask.

12. The phase shift mask of claim 1, wherein said opaque spacers have a width between about 300 and 3000 Angstroms.

13. The phase shift mask of claim 12, wherein said opaque spacers are chromium.

\* \* \* \* \*